(12) United States Patent
Chen et al.

(10) Patent No.: US 7,009,841 B2
(45) Date of Patent: Mar. 7, 2006

(54) REMOVABLE FAN MODULE

(75) Inventors: Yu-Lin Chen, Pan Chiao (TW); Sheng-Fu Hsu, Chung Ho (TW)

(73) Assignee: Quanta Computer, Inc., Tao Yuan Shien (TW)

( * ) Notice: Subject to any disclaimer, the term of this patent is extended or adjusted under 35 U.S.C. 154(b) by 39 days.

(21) Appl. No.: 10/870,960

(22) Filed: Jun. 21, 2004

(65) Prior Publication Data

US 2005/0105269 A1 May 19, 2005

(30) Foreign Application Priority Data

Nov. 18, 2003 (TW) ............................. 92220394 U

(51) Int. Cl.
*H05K 7/20* (2006.01)

(52) U.S. Cl. .................. 361/695; 165/80.3; 415/213.1
(58) Field of Classification Search ................ 361/690, 361/694, 695; 257/718, 719, 721, 727; 174/16.1, 174/16.3; 165/80.3, 122; 454/184; 415/213.1
See application file for complete search history.

(56) References Cited

U.S. PATENT DOCUMENTS

| 5,562,410 | A | * | 10/1996 | Sachs et al. ............. 415/213.1 |
| 5,822,186 | A | * | 10/1998 | Bull et al. .................. 361/695 |
| 6,031,719 | A | * | 2/2000 | Schmitt et al. ............. 361/695 |
| 6,244,953 | B1 | * | 6/2001 | Dugan et al. ............... 454/184 |
| 6,316,718 | B1 | * | 11/2001 | Lin ........................ 174/17 VA |
| 6,587,342 | B1 | * | 7/2003 | Hsu ........................... 361/695 |
| 6,611,427 | B1 | * | 8/2003 | Liao .......................... 361/695 |
| 6,731,502 | B1 | * | 5/2004 | Hsu ........................... 361/695 |
| 2004/0202541 | A1 | * | 10/2004 | Stewart et al. ........... 415/213.1 |

* cited by examiner

*Primary Examiner*—Boris Chervinsky
(74) *Attorney, Agent, or Firm*—Rabin & Berdo, PC

(57) ABSTRACT

A removable fan module is disclosed for integrating a fixing device of a fan unit with a handle of the fan module. The removable fan module is featured in installing an elastic plate having a protrusion body on the inner surface of the handle of the fan module, wherein the fan main body is fixed in the housing of the fan module via the protrusion body of the elastic plate resisting the fan unit. The present invention is to achieve the purpose of rapidly replacing the fan main body by using the application of the elastic plate of the handle and a hand hole located on the bottom of the fan module.

16 Claims, 6 Drawing Sheets

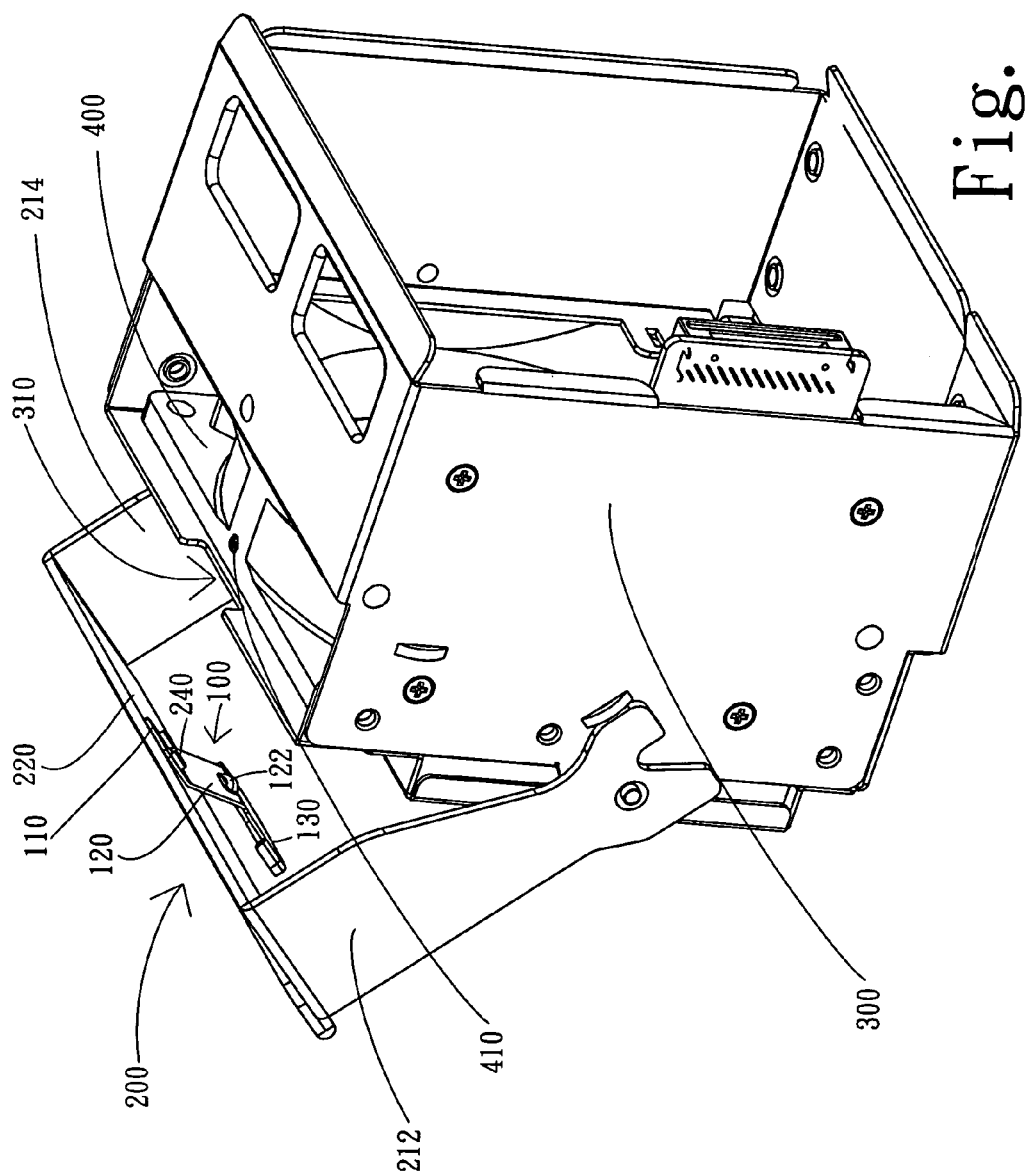

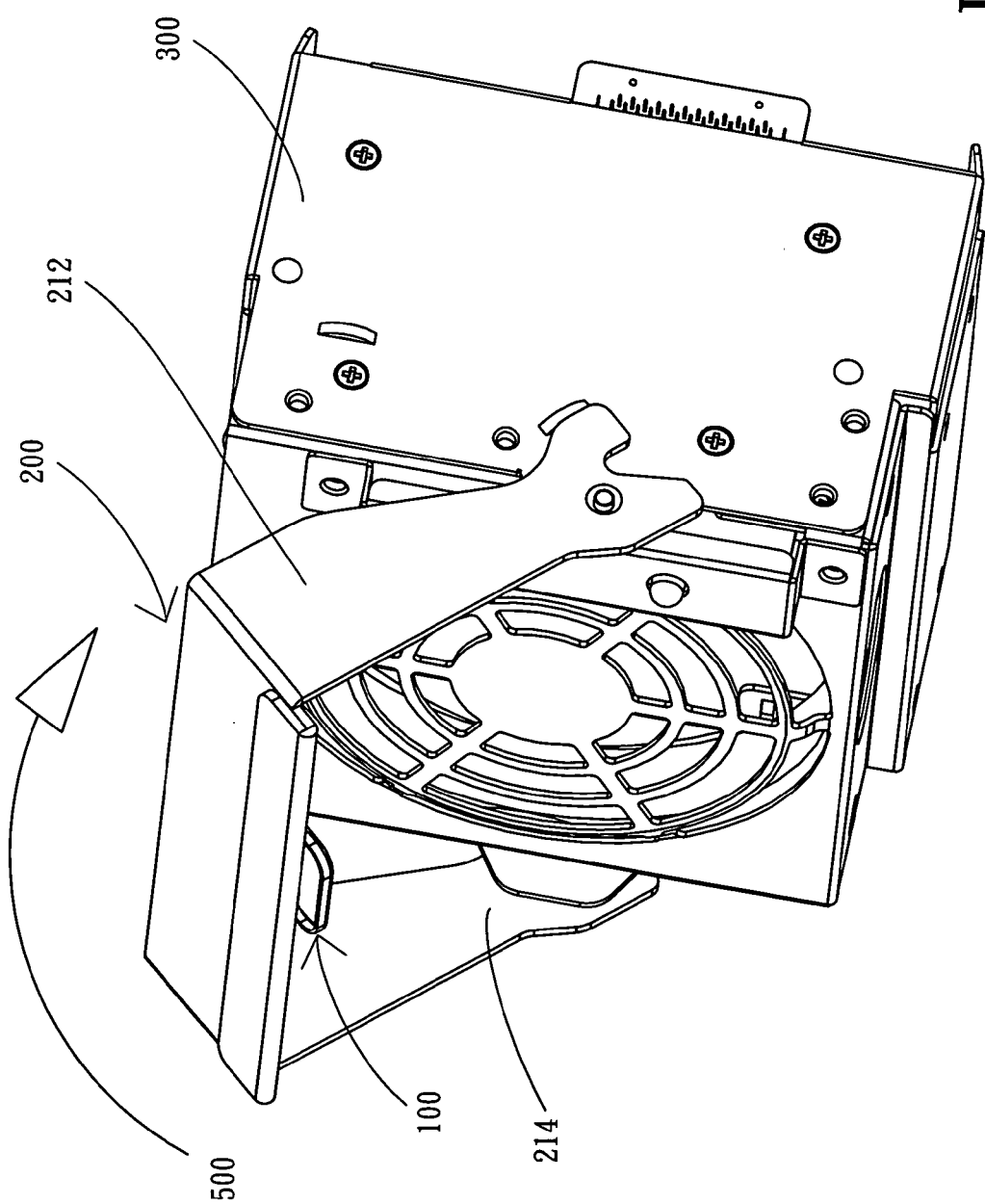

REMOVABLE FAN MODULE

FIELD OF THE INVENTION

The present invention relates to a removable fan module, and more particularly, to the fan module of which a handle is integrated with a fixing device for securing a fan main body, wherein the fan module is applicable in a computer system.

BACKGROUND OF THE INVENTION

It is a common technique to use fans in various industrial equipments for heat dissipation, especially in widely used electronic products. With the increase of various applications, the number of electronic modules installed in one single electronic product also increases. Based on the design consideration of space, the electronic modules are usually stacked vertically in a housing of an electronic product. Since the number of the electronic modules is quite a few, multiple fan modules have to be installed in the electronic product, thereby effectively resolving the heat-dissipation problems of those electronic modules. Generally speaking, the fan modules installed in the electronic product are exposed to the ambiance so as to dissipate heat thereto.

A fan module often needs to be replaced or repaired, and is deteriorated easily. Therefore, for conveniently repairing the fan module, the conventional fan module deign is generally to dispose the fan module alone in a fan storage area of a housing body, and then to secure the fan module with a fixing device, such as a clipping hook engaged with an opening. However, the application of clipping hook has to occupy quite a lot of space in the housing body. For the current design of increasingly complicated electronic products, it is difficult to impose the fixing device of the clipping hook on the fan module due to the limitation of space. Further, while the fan module is dismantled or installed, there are shortcomings of difficult dismantling and easy fracture for using the fixing device of the clipping hook. On the other hand, a handle device has to be additionally designed for a user to access the fan module easily, causing more bother for designers.

Hence, there is a need to develop a removable fan module for reducing the space occupied by a fixing device and a handle device; simplifying the steps for dismantling and installing the fan module; preventing the fixing device from being damaged; and synchronously securing the handle device of the fan module, so that the aforementioned shortcomings can be overcome for the conventional fan fixing device.

SUMMARY OF THE INVENTION

It is an object of the present invention to provide a removable fan module, wherein a fixing device of a fan main body is integrated with a handle deice of the fan muddles, thereby saving the space occupied by the fixing device and the handle device; simplifying the steps for dismantling and installing the fan module; preventing the fixing device from being damaged; and synchronously securing the handle device of the fan module.

According to the aforementioned object of the present invention, the present invention provides a removable fan module for withdrawing a fan main body.

According to a preferred embodiment of the present invention, the removable fan module comprises: a housing body, a U-shaped handle, a fan main body and an elastic plate, wherein the U-shaped handle is pivotally connected to two sides of the housing body in a rotatable way, and the fan main body is disposed in one side of the housing body adjacent to the U-shaped handle, and the elastic plate is installed on a handle inner surface of a top side of the U-shaped handle facing the fan main body. The elastic plate has a protrusion body used to resist the fan main body via a contact point of the fan main body, so as to secure the fan main body in a fan storage area of the housing body.

Further, the elastic plate is composed of a plate fixing portion, a plate connecting portion and a plate open portion. The plate fixing portion is fixed on the handle inner surface, and one end of the plate connecting portion is connected to the plate fixing portion, wherein there is an angle between the plate fixing portion and the surface of the plate connecting portion facing the fan main body, and the angle is greater than 90 degrees and smaller than 180 degrees. The plate open portion is connected to the other end of the plate connecting portion, wherein there is an angle between the surface of the plate connecting portion facing the U-shaped handle and the surface of the plate open portion facing the U-shaped handle, and the angle is greater than 90 degrees and smaller than 180 degrees. There is a gap between the plate open portion and the handle inner surface, so that the elastic plate has the feature of elasticity. Further, the protrusion body is located on the plate fixing portion, and protrudes outwards in the direction towards to the housing body.

Further, the housing body has a concaved portion used for exposing the plate open portion from the housing body.

Moreover, according to the aforementioned object of the present invention, the present invention provides a computer system having a removable fan module, and the computer system comprises: an outer housing, a storage device installed in the outer housing, and the aforementioned removable fan module, wherein the removable fan module is installed on a sidewall of the outer housing, and is exposed to the ambiance.

Hence, with the application of the present invention, the space occupied by the fixing device and the handle device can be greatly reduced; the steps for dismantling and installing the fan module can be greatly simplified; and the fixing device can be prevented from damage; and the handle device of the fan module can be synchronously secured.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a 3-D schematic diagram depicting a removable fan module, according to a preferred embodiment of the present invention;

FIG. 3A and FIG. 3B are 3-D schematic diagrams respectively showing the handle in rotation, according to the preferred embodiment of the present invention.

DETAILED DESCRIPTION OF THE PREFERRED EMBODIMENT

Figure 2A:
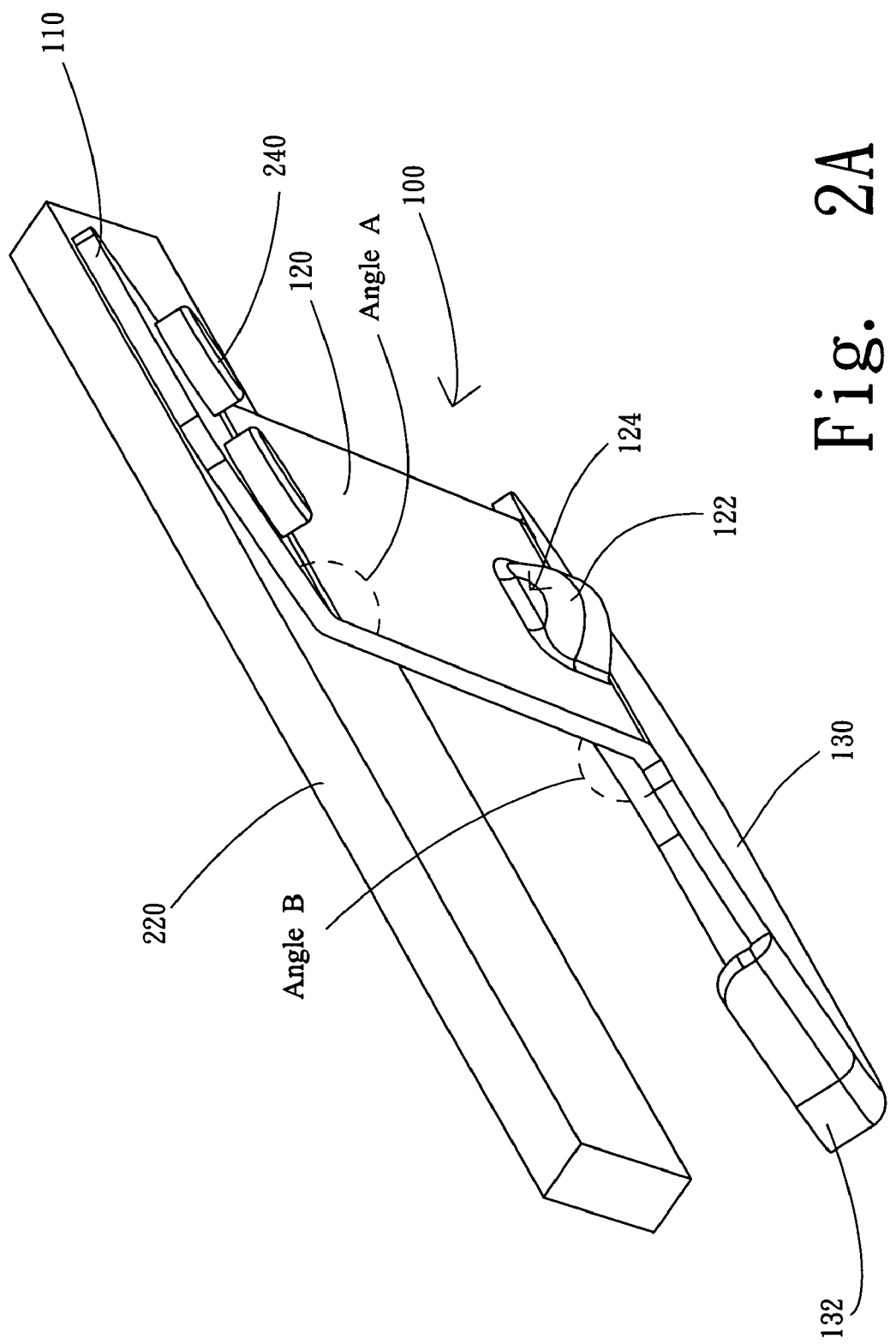
FIG. 2A and FIG. 2B are 3-D schematic diagrams showing the structure of an elastic plate used in the preferred embodiment of the present invention from different view angles.

Referring to FIG. 1, FIG. 1 is a 3-D schematic diagram depicting a removable fan module, according to a preferred embodiment of the present invention. A removable fan module of the present invention comprises: a housing body 300, a U-Shaped handle 200 and an elastic plate 100. The U-shaped handle 200 is composed of a handle side member 212, a handle side member 214, and a handle top member 220 connected to both the handle side member 212 and the handle side member 214, wherein the handle side members 212 and 214 are pivotally connected to both sides of the housing body 300 in a rotatable way. A fan main body 400 is disposed in the housing body 300, and is located on one side adjacent to the U-shaped handle 200. The elastic plate 100 is installed on an inner surface of the handle top member 220 of the U-shaped handle 200 facing the fan main body 400, and the elastic plate 100 has a protrusion body 122, so that the protrusion body 122 can resist the fan main body 400 on a contact point 410 when the U-shaped handle 200 is moved to the top of the housing body 300, thereby securing the fan main body 400 in the housing body 300, and also fixing the U-shaped handle 200 synchronously.

The elastic plate 100 is composed of a plate fixing portion 110, a plate connecting portion 120 and a plate open portion 130. The plate fixing portion 110 is fixed to the U-shaped handle 200 by riveting; or is fixed on the inner surface of the handle top member 220 by using at least on fastening element 240 (such as a screw), and the protrusion body 122 is located on the lower surface of the plate connecting portion 120, and protrudes outwards in the direction towards to the housing body 300. Further, the housing body 300 has a concaved portion 310 used for exposing the plate open portion 130 from the housing body 300, when the U-shaped handle 200 is rotated to the top of the housing body 300.

Figure 2B:
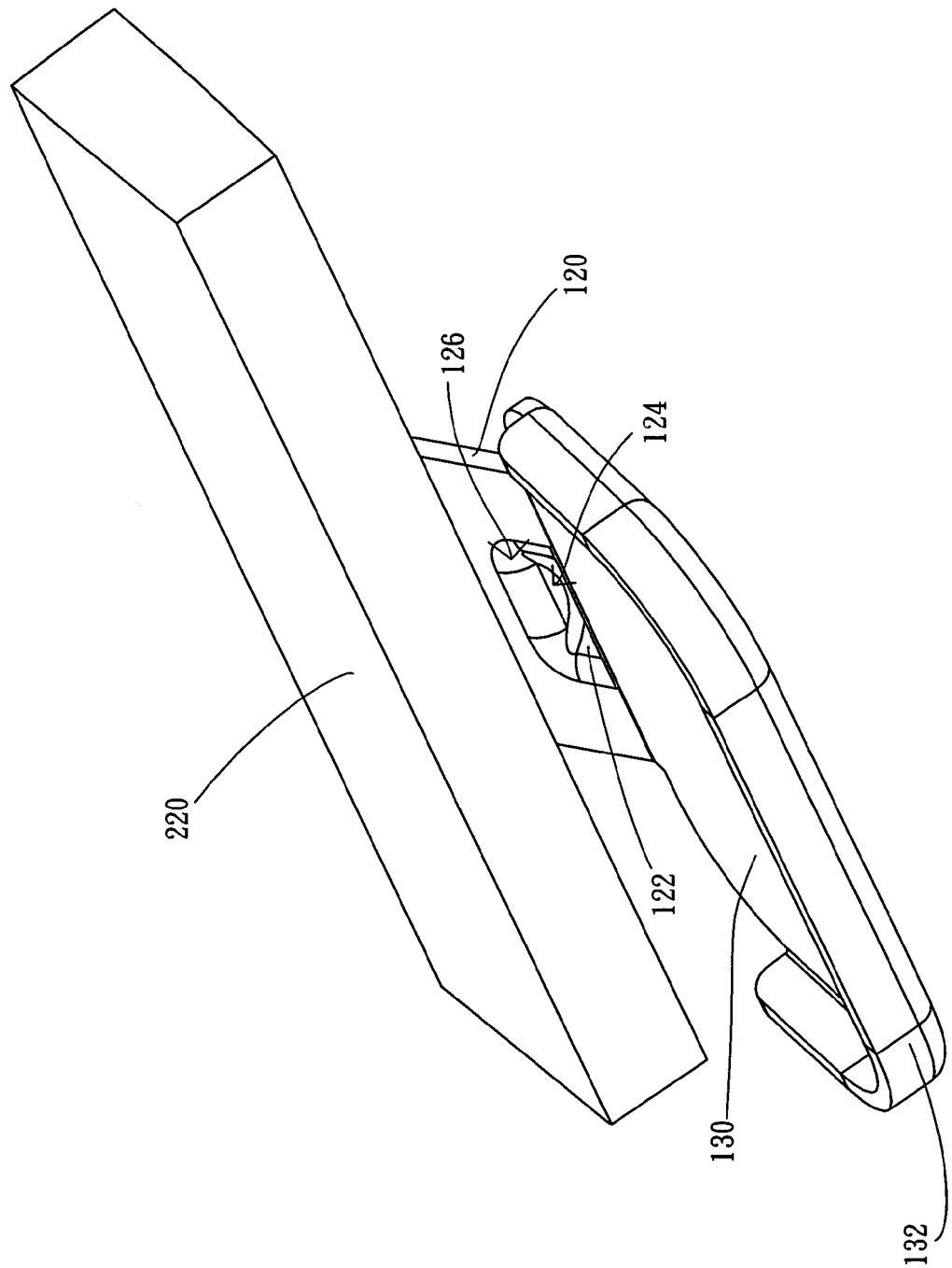

Referring to FIG. 2A and FIG. 2B, FIG. 2A and FIG. 2B are 3-D schematic diagrams showing the structure of the elastic plate 100 used in the preferred embodiment of the present invention from front and rear view angles respectively. As shown in FIG. 2A, one end of the plate connecting portion 120 is connected to the plate fixing portion 110, wherein there is an angle A between the surface of the plate fixing portion 110 facing the fan main body 400 and the surface of the plate connecting portion 120 facing the fan main body 400, and the angle A is greater than 90 degrees and smaller than 180 degrees. The plate open portion 130 is connected to the other end of the plate connecting portion 120, wherein there is an angle B between the surface of the plate connecting portion 120 facing the handle top member 220 and the surface of the plate open portion 130 facing the handle top member 220, and the angle B is greater than 90 degrees and smaller than 180 degrees, whereby a gap is formed between the plate open portion 130 and the inner surface of the handle top member 220, thus enabling the elastic plate 100 to have the feature of elasticity.

Further, the protrusion body 122 can be fabricated by a pressing method, wherein the protrusion body 122 is formed extrusively on the plate connecting portion 120 directly, and thus a hole 124 is allowed to exist in the protrusion body 122, as long as the protrusion body 122 can seize the fan main body. Further, as shown in FIG. 2B, the protrusion body 122 can be a hollow structure, i.e. the surface of the protrusion body 122 facing the handle top member 220 is a depression region 126. However, the aforementioned structures of the protrusion body 122 are merely stated as examples for explanation, and the present invention is not limited thereto, so that the protrusion body 122 of the present invention can be any structure that can seize the fan main body. Further, a protrusive edge 132 can be formed to surround at least one portion of the edge of the plate open portion 130, whereby a user can conveniently apply force to lift the elastic plate 100 to let the protrusion body 122 off the fan main body. The protrusive edge 132 protrudes preferably from the plate open portion 130 to the handle top member 220.

It is worthy to be noted that the material forming the elastic plate 100 can be any elastic material. However, for the consideration of saving the molding expense and convenient process, the protrusion body of the present invention can be made of metal material, such as BeCu Alloy or stainless steel, preferably.

Figure 3A:
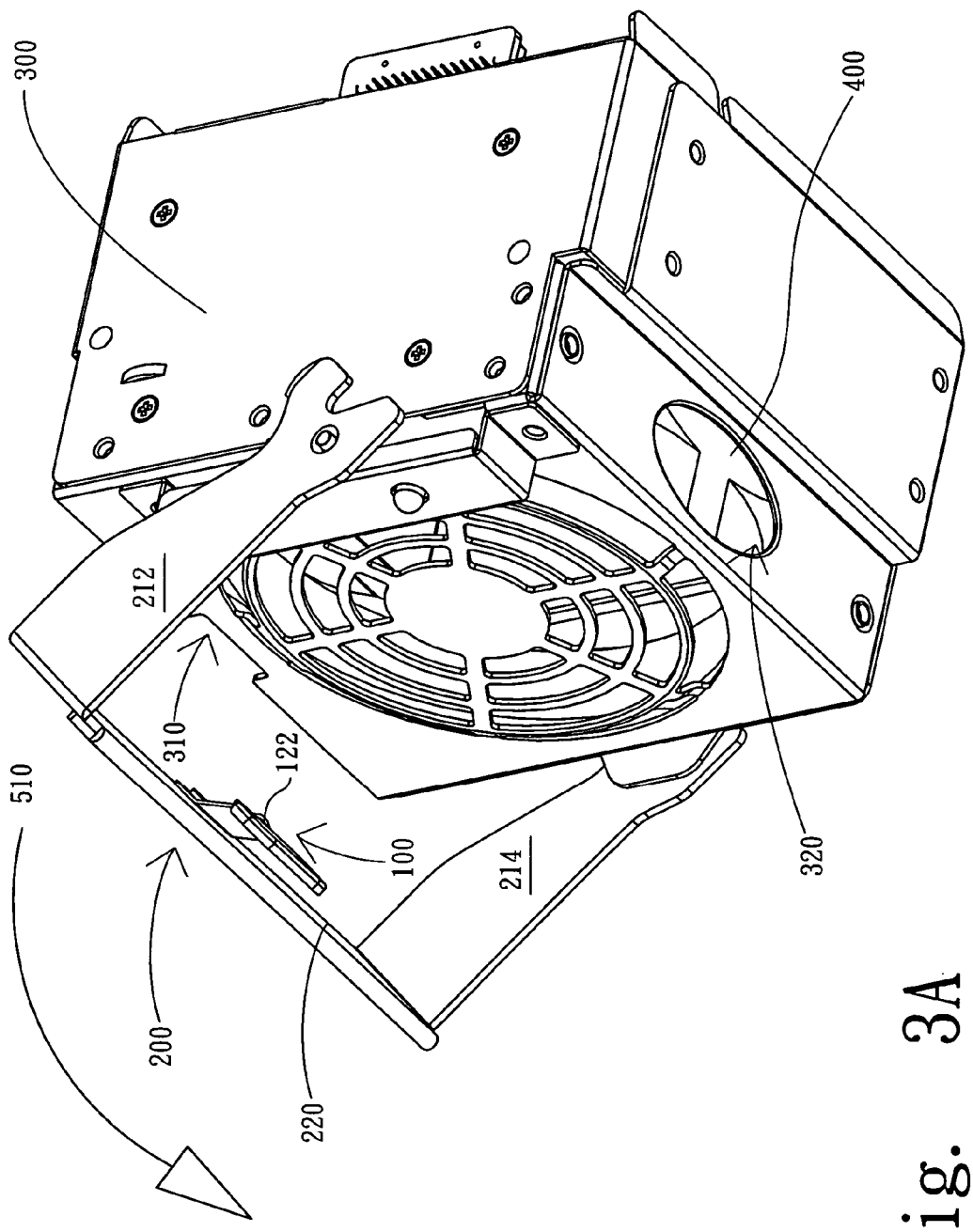

Referring to FIG. 3A and FIG. 3B, FIG. 3A and FIG. 3B are 3-D schematic diagrams respectively showing the handle in rotation, according to the preferred embodiment of the present invention. As shown in FIG. 3A, there is a hand hole 320 located at the bottom of the housing body 300 for users to move the fan main body conveniently. When intending to dismantle the fan main body, the users only have to push the plate open portion 130 upwards, and then to rotate the U-shaped handle 200 along a handle rotating direction 510 after the protrusion body 122 is off the fan main body 400, so as to force the U-shaped handle 200 to move away from the housing body 300. Thereafter, with the use of the hand hole 320, the fan main body can be taken out of the housing body 300 easily. As shown in FIG. 3B, when intending to secure the fan main body 400 in the housing body 300, the users only have to release the plate open portion 130, and then to rotate the U-shaped handle 200 along a handle rotating direction 500 to the top of the housing body 300, and the plate open portion 130 is automatically seized in the concaved portion 310 (as shown in FIG. 3A) due elasticity after the protrusion body 122 resists the fan main body 400, thereby fixing the fan main body 400 in the housing body 300.

Figure 4:
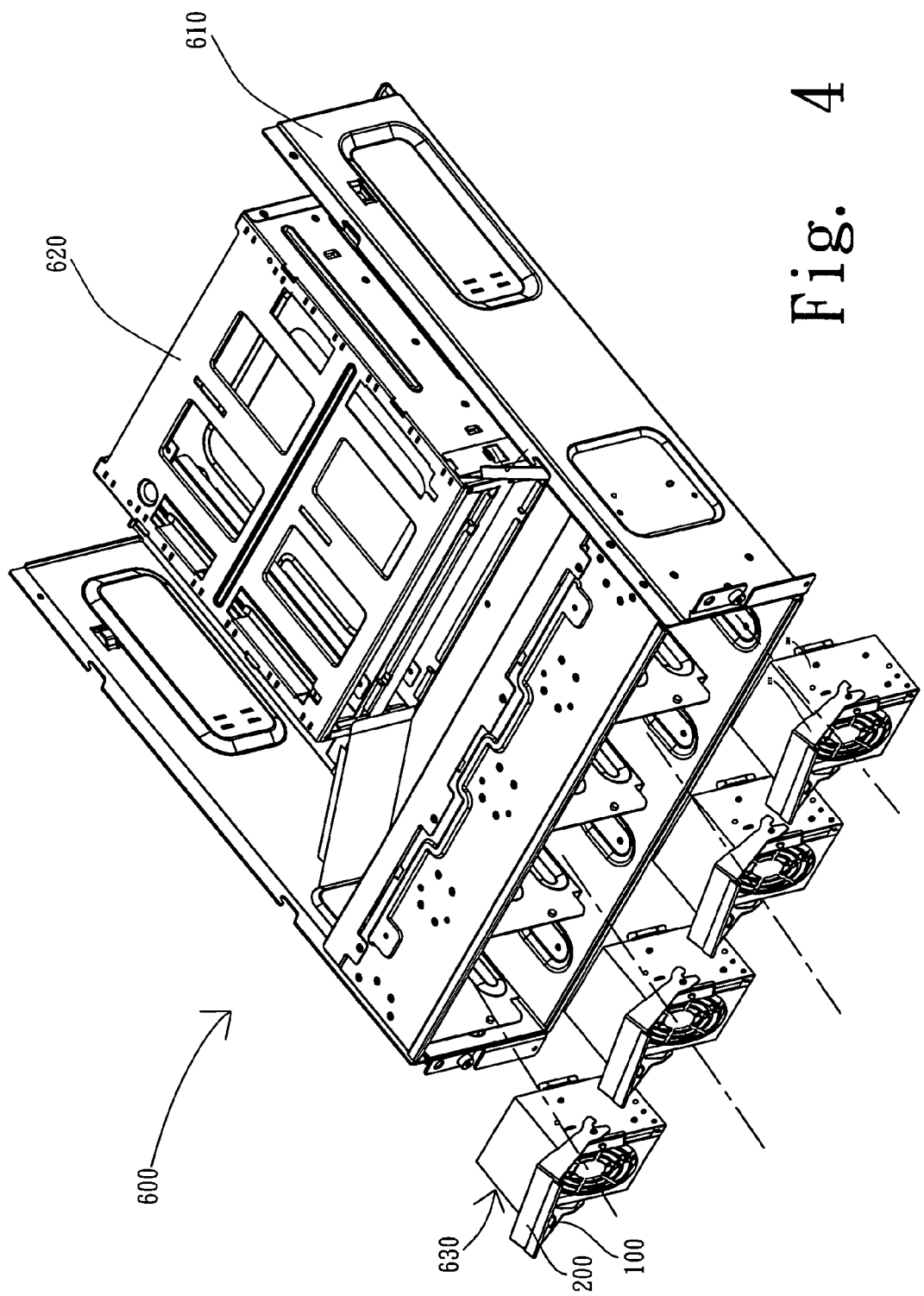
FIG. 4 is a 3-D schematic view showing the removable fan of the present invention assembled with a computer system.

Further, the present invention provides a computer system having a removable fan module. Referring to FIG. 3B and FIG. 4, FIG. 4 is a 3-D schematic view showing the removable fan of the present invention assembled with a computer system. A computer system 600 comprises: an outer housing 610, a storage device 620, and at least one removable fan module 630 (which is identical to the one shown in FIG. 3B). A storage device 620 installed in the outer housing 610, and the removable fan module 630 is installed on a sidewall of the outer housing 610, and is exposed to the ambiance. When the removable fan module 630 is installed in a computer system 600, the U-shaped handle 200 can be seized in the outer housing 610, so that the pressure exerted on the fan main body (as shown in FIG. 1) from the protrusion body 122 (as shown in FIG. 3B) of the elastic plate 100 can be reinforced.

Hence, with the application of the present invention, the fixing device of the fan main body can be integrated with the handle of the fan module, thus overcoming the shortcomings of the conventional fan fixing device.

It can be known from the aforementioned preferred embodiment of the present invention, the advantages of applying the present invention are: greatly saving the space occupied by the fixing device and the handle device; greatly simplifying the steps for dismantling and installing the fan module; effectively preventing the fixing device from being damaged; and synchronously securing the handle device of the fan module. Thus, the present invention has highly industrial application value.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A removable fan module, comprising:
   a housing body having two corresponding sides;
   a U-shaped handle having a top side, wherein said U-shaped handle is pivotally connected to said two sides of said housing body in a rotatable way;
   a fan main body, disposed in said housing body adjacent to said U-shaped handle; and
   an elastic plate, installed on a handle inner surface of said top side of said U-shaped handle facing said fan main body, wherein said elastic plate has a protrusion body used to resist said fan main body via a contact point of said fan main body, thereby securing said fan main body in said housing body.

2. The removable fan module of claim 1, wherein said U-shaped handle has a top member and a side member, and said side member is pivotally connected to said two sides of said housing body in said rotatable way.

3. The removable fan module of claim 1, wherein said elastic plate comprises:
   a plate fixing portion, fixed on said handle inner surface;
   a plate connecting portion, wherein one end of said plate connecting portion is connected to said plate fixing portion, and there is a first angle between said plate fixing portion and the surface of said plate connecting portion facing said fan main body, and said first angle is greater than 90 degrees and smaller than 180 degrees; and
   a plate open portion, wherein said plate open portion is connected to the other end of said plate connecting portion, wherein there is a second angle between the surface of said plate connecting portion facing said U-shaped handle and the surface of said plate open portion facing said U-shaped handle, and said second angle is greater than 90 degrees and smaller than 180 degrees, and there is a gap between said plate open portion and said handle inner surface, so that said elastic plate has the feature of elasticity.

4. The removable fan module of claim 3, wherein said protrusion body is located on said plate fixing portion, and protrudes outwards in the direction towards to said housing body.

5. The removable fan module of claim 3, wherein said plate fixing portion is connected to said U-shaped handle by riveting.

6. The removable fan module of claim 3, wherein said housing body has a concaved portion used for exposing said plate open portion from said housing body.

7. The removable fan module of claim 1, wherein the material forming said elastic plate is selected from the group consisting of BeCu alloy and stainless steel.

8. The removable fan module of claim 1, wherein said housing body has a hand hole used for moving and replacing said fan main body.

9. A computer system having a removable fan module, said computer system comprises:
   an outer housing;
   a storage device, installed in said outer housing; and
   a removable fan module, installed on a sidewall of said outer housing, wherein said removable fan module is exposed to the ambiance, said removable fan module comprising:
   a housing body having two corresponding sides;
   a U-shaped handle having a top side, wherein said U-shaped handle is pivotally connected to said two sides of said housing body in a rotatable way;
   a fan main body, disposed in said housing body adjacent to said U-shaped handle; and
   an elastic plate, installed on a handle inner surface of said top side of said U-shaped handle facing said fan main body, wherein said elastic plate has a protrusion body used to resist said fan main body via a contact point of said fan main body, thereby securing said fan main body in said housing body.

10. The computer system of claim 9, wherein said U-shaped handle has a top member and a side member, and said side member is pivotally connected to said two sides of said housing body in said rotatable way.

11. The computer system of claim 9, wherein said elastic plate comprises:
    a plate fixing portion, fixed on said handle inner surface;
    a plate connecting portion, wherein one end of said plate connecting portion is connected to said plate fixing portion, and there is a first angle between said plate fixing portion and the surface of said plate connecting portion facing said fan main body, and said first angle is greater than 90 degrees and smaller than 180 degrees; and
    a plate open portion, wherein said plate open portion is connected to the other end of said plate connecting portion, wherein there is a second angle between the surface of said plate connecting portion facing said U-shaped handle and the surface of said plate open portion facing said U-shaped handle, and said second angle is greater than 90 degrees and smaller than 180 degrees, and there is a gap between said plate open portion and said handle inner surface, so that said elastic plate has the feature of elasticity.

12. The computer system of claim 11, wherein said protrusion body is located on said plate fixing portion, and protrudes outwards in the direction towards to said housing body.

13. The computer system of claim 11, wherein said plate fixing portion is connected to said U-shaped handle by riveting.

14. The computer system of claim 11, wherein said housing body has a concaved portion used for exposing said plate open portion from said housing body.

15. The computer system of claim 9, wherein the material forming said elastic plate is selected from the group consisting of BeCu alloy and stainless steel.

16. The computer system of claim 9, wherein said housing body has a hand hole used for moving and replacing said fan main body.

* * * * *